United States Patent [19]

Olson

[11] Patent Number: 4,992,791

[45] Date of Patent: Feb. 12, 1991

[54] APPARATUS AND METHOD FOR DIGITAL TO ANALOG SIGNAL CONVERSION USING AN ANALOG TO DIGITAL SIGNAL CONVERTER

[75] Inventor: John C. Olson, Shoreview, Minn.

[73] Assignee: American Standard Inc., New York, N.Y.

[21] Appl. No.: 340,115

[22] Filed: Apr. 13, 1989

[51] Int. Cl.[5] ............................................ H03M 1/00
[52] U.S. Cl. ...................................... 341/126; 341/155
[58] Field of Search ............... 341/110, 142, 145, 144, 341/126; 364/481, 483, 138, 139

[56] References Cited

U.S. PATENT DOCUMENTS 3,872,389 3/1975 Willard ................................ 364/139
4,121,205 10/1978 Iga et al. ............................... 341/153
4,233,500 11/1980 Cordill .................................. 341/141

Primary Examiner—William M. Shoop, Jr.
Assistant Examiner—Helen Kim
Attorney, Agent, or Firm—William J. Beres; David L. Polsley; William O'Driscoll

[57] ABSTRACT

A digital to analog signal converter apparatus for converting digital signals to analog signal outputs. The converter apparatus includes a microprocessor, a low pass filter portion for converting a digital output signal from the microprocessor to an analog output signal, and an analog to digital converter portion for sampling and converting the analog output signal to provide a digital input to the microprocessor, permitting control of the analog output signal.

14 Claims, 2 Drawing Sheets

| PROCESSOR 12 | | ANALOG TO DIGITAL DEVICE 50 | | REFERENCE NUMBER |
|---|---|---|---|---|
| SOFTWARE | PINOUT | PINOUT | SOFTWARE | |
| ∅ | 31 | 19 | SYSTEM CLOCK | 60 |
| PORT 4, LINE 3 | 15 | 15 | CHIP SELECT | 62 |
| PORT 4, LINE 2 | 16 | 18 | SERIAL CLOCK | 64 |
| PORT 4, LINE 1 | 17 | 17 | SERIAL DATA IN | 66 |
| PORT 4, LINE 0 | 18 | 16 | SERIAL DATA OUT | 68 |

FIG. 2

APPARATUS AND METHOD FOR DIGITAL TO ANALOG SIGNAL CONVERSION USING AN ANALOG TO DIGITAL SIGNAL CONVERTER

DESCRIPTION

TECHNICAL FIELD

This invention pertains generally to the field of electronic signal devices and specifically to apparatus for digital to analog signal conversion suitable for applications in controllers for heating, ventilating, and air conditioning units and other air handling equipment.

BACKGROUND ART

A typical digital to analog signal converter apparatus is comprised of a monolithic or single digital to analog converter device, wherein a digital signal is input and a variable analog output signal is provided in response thereto. Such devices are typically electronic integrated circuit chips and may be utilized in microprocessor-based control devices to control apparatus which require an analog voltage input. The digital to analog signal conversion is necessary in this situation due to the fact that the output of the typical controlling microprocessor is in the form of digital signal unintelligible to an analog apparatus or device.

Typically, a single microprocessor-based controller will desirably control several analog devices to minimize the cost of the controller. However, because of the relative expense of the monolithic digital to analog signal converter chip, it is undesirable to provide for each analog device an individual monolithic digital to analog converter chip. Therefore, numerous approaches have been taken to reducing the expense of devices incorporating such monolithic digital to analog converter chips. The various approaches have included the provision of multiplexer circuitry, sample and hold circuitry, and opamp circuitry. These solutions typically provide that the monolithic digital to analog converter chip handles a plurality of analog outputs by sampling the digital signal directed to each output and fixing an analog output voltage which is held until the monolithic digital to analog converter again is available to sample and adjust that analog output. While these approaches eliminate the need for multiple monolithic digital to analog signal converter chips, they require the incorporation of a relatively large number of components, while rendering impossible the continuous control of the analog output for each analog output for each analog device being controlled by the microprocessor.

Therefore, it has been necessary to provide either a number of relatively expensive monolithic digital to analog converter chips to maintain continuous control of each analog device, or, alternatively, to provide only a single monolithic digital to analog converter chip and utilize one of a variety of relatively complex switching circuits to provide partial, intermittent control of the analog signal output.

Furthermore, typical digital to analog signal converters provide an arbitrary analog voltage output signal when the monolithic digital to analog signal converter is powered up. Therefore it is often necessary to provide safeguards in the form of additional circuitry in the controller in order to prevent any such arbitrary signals. An arbitrary output signal from the control device would cause the analog device to respond in an arbitrary fashion with unpredictable and possibly even unsafe results.

Thus, it is an object of the invention to provide a digital to analog signal converter having the capability for continuous monitoring of the analog output signal.

It is an object of the invention to provide such a digital to analog signal converter device which has a minimum of circuitry components.

Another object of the invention is to provide a digital to analog signal converter device utilizing relatively inexpensive circuitry components.

Yet another object of the invention is to provide a digital to analog signal converter device which will be simple to manufacture and maintain.

Yet a further object of the invention is to provide a digital to analog converter device which provides a zero output upon the initial power-up condition to eliminate the necessity of expensive safeguard circuitry.

A still further object of the invention is to provide a digital to analog signal converter device suitable for an inexpensive and simple application to a microprocessor operated device controlling a plurality of analog devices.

These and other objects of the invention will become apparent from the attached drawing and the description of the preferred embodiment that follows hereinafter.

SUMMARY OF THE INVENTION

The subject invention is a digital to analog signal converter apparatus comprised of a microprocessor having a digital output signal, a low pass filter portion for receiving and converting to a corresponding analog output signal the digital output signal from the microprocessor, an analog to digital signal converter for monitoring the analog output signal and providing a corresponding digital monitor signal input to the microprocessor, permitting the microprocessor to adjust the digital output signal and hence the analog output signal based upon the digital monitor signal.

BRIEF DESCRIPTION OF THE DRAWINGS

FIG. 2 details in tabular form the pinout connections and functions performed in the preferred embodiment.

DESCRIPTION OF THE PREFERRED EMBODIMENT

Figure 1:
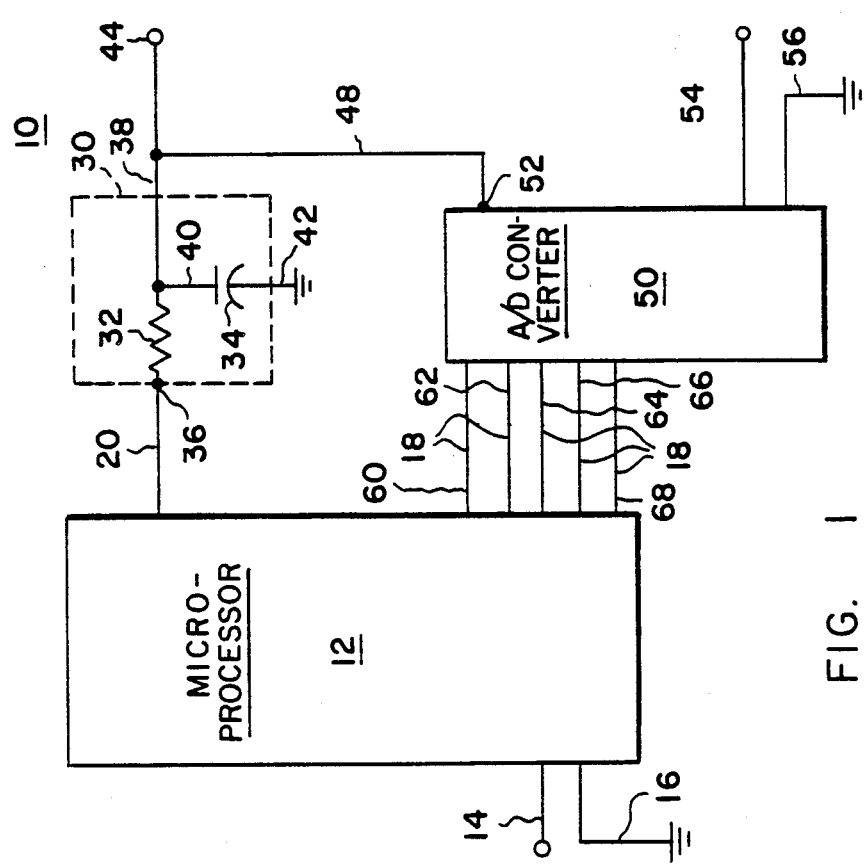
FIG. 1 shows in schematic view a digital to analog signal converter apparatus according to the preferred embodiment.

A digital to analog signal converter according to the subject invention and designated generally by the reference numeral 10 is shown in FIG. 1. The signal converter 10 includes a processor portion 12 which is preferably comprised of a readily available microprocessor chip such as the Mitsubishi Model M50747 processor chip, which includes or controls Random Access Memory (RAM) and Read Only Memory (ROM) containing controlling software and instructions for the operation of the microprocessor 12. It will be appreciated by those skilled in the art that there are numerous microprocessor devices suitable for use as the processor portion 12 and that the microprocessor designated and discussed herein is to be taken as exemplary rather than limiting.

The processor 12 includes a plurality of designated input and output connections or pinouts, most of which are not shown or discussed herein as not relevant to the structure or operation of the subject invention. While the specific pinout connections are shown, this again is to be taken as exemplary and by way of clarification of the subject invention rather than as limiting the application or implementation of the subject invention.

A voltage supply line 14 is connected to pinout number 1 to provide a supply voltage Vcc. This supply voltage may be on the order of 5.25 volts. A processor ground line 16 provides a grounding connection for the processor 12 at pinout number 32. At least one line comprising a first digital signal input 18 is connected to the processor 12 and an output line 20 is connected to the processor 12 at pinout 14 for providing an output line for transmitting a second digital signal. The digital signal input 18 and the digital signal output 20 are discussed in more detail hereinbelow.

The digital signal output line 20 connects to a low pass filter portion 30. The low pass filter portion 30 is comprised of a resistance element 32 and a capacitance element 34 which are disposed within the low pass filter portion 30 so that the input 36 to the resistance element 32 acts as the filter input and the output 38 of the resistance element 32 acts as the filter output. The capacitance element 34 has an input 40 connected also to the resistance element output 38 and an output 42 which is connected to a ground point. A signal connection point 44 is provided for connecting the signal converter 10 to any device or system to which an analog signal is to be provided.

A sampling feedback line 48 connects the filter output line 38 to an analog to digital converter portion 50 at a converter input 52. The analog to digital converter device is provided with a plurality of inputs and outputs, a portion of which are connected to the digital signal input lines 18 of the processor portion 12. Preferably, the analog to digital converter portion is an integrated electronic circuit chip device such as the Texas Instruments model no. TLC1541 or the National Semiconductor Corp. model no. ADC0838. It will be appreciated by those skilled in the art that there are a number of integrated electronic circuit devices equally suitable for use in the subject invention, and that the designated chip devices and designated pinouts or connections are exemplary and not to be taken as limiting.

Preferably, the sampling feedback line 48 connects to pinout 1 of the analog to digital chip device 50. A reference voltage Vref is provided at pinout 14 from the reference voltage input line 54, and a reference voltage ground line 56 connects to pinout number 13. The reference voltage Vref supplied is on the order of 4 volts.

In the preferred embodiment, the digital input line 18 which provides the first digital signal to the microprocessor 12 is comprised of a plurality of lines connecting between the analog to digital converter chip 50 and the microprocessor 12. FIG. 2 also indicates the pinouts used on the respective chip devices as well as the function performed by each of the connecting lines 60–68. For example, the connecting line 60 provides the system clock count PHI from the microprocessor 12 to the analog to digital converter 50. Port 4, lines 0–3 are the addresses given to the indicated pinouts by controlling software in the microprocessor 12. The line 62 provides a chip select indication to the device 50 from the microprocessor 12, the line 64 provides a serial clock count between the microprocessor 12 and the analog to digital device 50 to indicate the rate of data transmission, and the lines 66 and 68 serve as serial data transmission lines between the analog to digital converter device 50 and the microprocessor 12. It will be readily apparent to those skilled in the art that other groups of pinouts from the microprocessor 12 could be assigned, for example, as port 3, port 2, and so on, enabling a single microprocessor 12 to be connected to a plurality of filter portions 30 and analog to digital converter devices 50 and hence provide a plurality of analog voltage outputs.

In operation, the microprocessor 12 is powered up by providing a power supply voltage Vcc to the microprocessor 12. At this time the analog voltage output at the filter output 38 is zero volts. According to software instructions contained in the microprocessor 12 RAM and ROM, the digital output line 20 may be set at zero volts, a low voltage signal, or a high voltage signal corresponding to the voltage of the power supply voltage Vcc. When the microprocessor determines that an analog output voltage at the output 44 is desirable, the digital output voltage at line 20 and hence at the filter input 36 is set to the high condition. The low pass filter portion 30, due to its resistive and capacitive elements 32 and 34 begins the transition from a zero voltage output at the filter output 38 to an analog output voltage corresponding to the filter input voltage or Vcc. As this output voltage increases, it is sampled continuously by the analog to digital converter device 50 via the feedback line 48 at a suitable sampling rate S. The analog to digital converter device 50 converts the sampled analog signal to a corresponding digital signal and transmits the converted signal as a digital input to the microprocessor 12 through the transmission lines 60 to 68.

The analog to digital converter device 50 is typically provided with a reference voltage on the order of 4 volts, and hence will provide a signal to the microprocessor 12 that the desired analog voltage output has been exceeded when this reference voltage has been exceeded under any condition. The microprocessor 12 compares the digital signal received from the analog to digital converter device 50 to target values or conditions preset in its software control routine or to target values which are determined by the software control routines in response to other inputs to the microprocessor 12 which are not shown herein for the sake of clarity. The microprocessor determines the deviation of the first digital signal from the analog to digital converter device 50 and alters the second or output digital signal to line 20 in response to the deviation from the target condition. In the event that the microprocessor 12 determines that the analog voltage output is at or has exceeded either the desired analog voltage output or the desired amount of time for which the analog voltage output is to be maintained, the digital output signal to line 20 is set to the low condition or to the off condition. When the digital output signal through line 20 is thus reduced, the low pass filter portion 30 begins to transition the analog voltage output at the filter output 38 toward the lower value or toward zero respectively. As before, this analog output voltage is continuously monitored by the microprocessor 12 based upon the converted digital signal received from the analog to digital converter device 50. Thus, the digital output voltage to line 20 is set to the high condition, low condition or off condition as required to cause the low pass filter portion to transition toward a higher or lower analog voltage output as is required to maintain the desired voltage.

Figure 3:
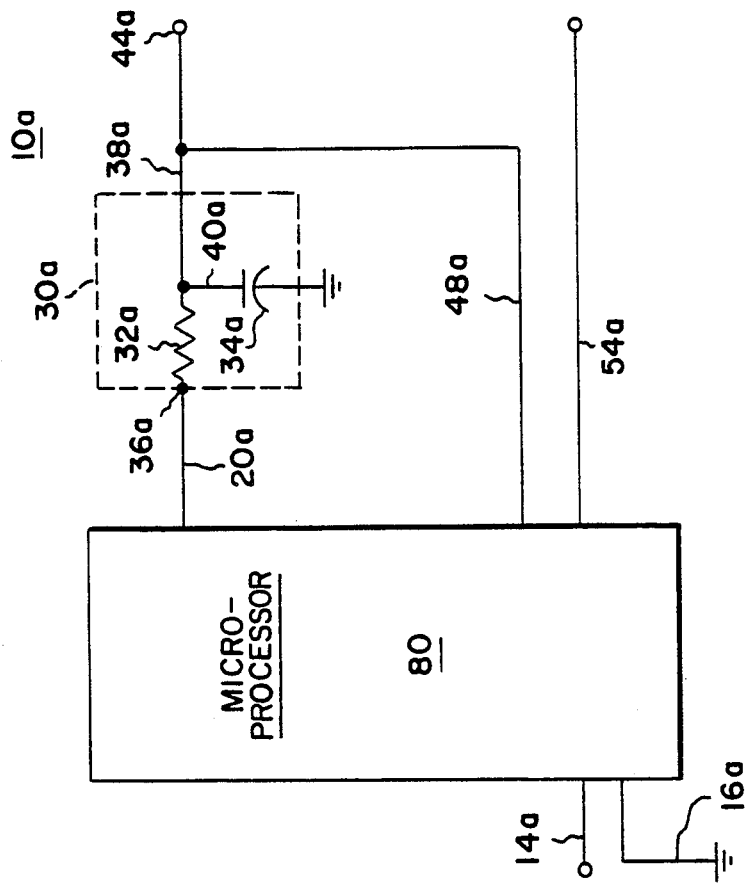
FIG. 3 shows in schematic view a digital to analog signal converter apparatus according to an alternative embodiment.

FIG. 3 discloses an alternative embodiment of the subject invention in which the digital to analog converter 10a includes a microprocessor 80 having an integral analog to digital converter device. Such devices are relatively well known in the art and are exemplified in, but not limited to, the Mitsubishi Corporation Model 50940, the Motorola Company Model Number 6805R2, or the National Semiconductor Model COP844CF. The suffix "a" is appended to the reference numerals of the alternative embodiment to denote those items or elements which correspond to like numbered items or elements of the preferred embodiment.

The alternative embodiment includes a power supply voltage source on line 14a, a grounding line 16a and a digital output line 20a as in the preferred embodiment. Likewise, the alternative embodiment is provided with a low pass filter portion 30a including a resistance element 32a having an input 36a acting as the filter input and an output 38a acting as the filter output with an analog voltage output connection 44a for connection to the device or other system to which the analog voltage output is directed. The capacitance element 34a is connected to the resistance element output 38a by a capacitance input line 40a and the capacitance element 34a is provided with a grounding connection 42a as in the preferred embodiment.

In the alternative embodiment, the sampling feedback line 48a runs directly to a pinout connection on the microprocessor 80 corresponding to the integral analog to digital converter input of the microprocessor 80. Likewise, the reference voltage Vref is provided to a pinout connection in the microprocessor 80 which corresponds to the analog to digital processor portion thereof.

In operation, the alternative embodiment provides control of the analog voltage output in a manner identical with that of the preferred embodiment.

It is believed that the preferred embodiment is preferable to the alternative embodiment in that it provides the ability to select an analog to digital converter device 50 which permits a less expensive combination of microprocessor 12 and analog to digital converter device 50 which is less expensive than the microprocessor chip 80 having the integral analog to digital converter device. Also, the preferred embodiment permits the selection of an analog to digital converter device having a different degree of accuracy A, for example, 8 bit or 10 bit, which in turn affects the resolution of the signal conversion N (where $N=2^A$) of the analog signal to a corresponding digital signal.

In the preferred embodiment, a 10 bit accuracy analog to digital converter device 50 is used at a continuous sampling rate in the range, for example, of one sample per microsecond to one sample per second, and preferably at the rate of 1/60th per second between samples of the analog voltage output. The resistance element 32 is a resistor having a resistance value R, for example, of $22 \times 10^4$ ohms, and the capacitance element 34 is a capacitor having a capacitance value C, for example, of $33 \times 10^{-6}$ farads. It will be apparent to those skilled in the art that the transition time for the analog voltage output will vary substantially according to the values chosen for the components. The transition time is then calculable according to the formula [−(resistance value R) * (capacitance value C) * natural log(1/signal conversion accuracy N)]. It is believed that those skilled in the art are well versed in the application of digital to analog converter devices generally, and that no further detailed discussion of the selection of such component values or of the application of the subject invention is necessary herein.

Those skilled in the art will readily appreciate the advantages of the low cost and extremely simplicity of the subject invention. Furthermore, zero voltage condition at the analog voltage output 44 upon powerup of the subject invention provides obvious advantages in eliminating unnecessary control devices to prevent arbitrary voltage outputs of the analog to digital converter upon startup, thus permitting the application of the subject invention in controllers and devices which require a zero voltage output upon powerup for safety reasons or to prevent undesirable arbitrary actions of devices controlled by analog voltage signals. Thus, the subject invention provides an inexpensive digital to analog converter suitable for application in a wide range of situations, reducing the expense of such devices while increasing the safety of devices incorporating systems operated by analog voltage controls.

It will be appreciated that because the subject invention is relatively simple and inexpensive it provides substantial advantages over the known prior art.

Modifications to the preferred embodiments of the subject invention will be apparent to those skilled in the art within the scope of the claims that follow herein.

What is claimed is:

1. A digital to analog signal converter comprised of:
    a processor portion including a first processor input for receiving a first digital signal, and a processor output for transmitting a second digital signal, said processor portion further sampling said first digital signal and controlling said second digital signal in response thereto;
    a low pass filter portion having a filter input for receiving said second digital signal and a filter output for transmitting an analog signal;
    an analog to digital converter portion having a converter input for receiving said analog signal and a converter output for transmitting said first digital signal to said processor portion.

2. The digital to analog signal converter as set forth in claim 1 wherein said analog to digital converter portion samples said analog signal and controls said first digital signal in response thereto.

3. A digital to analog signal converter having an analog voltages output of zero volts on startup, said digital to analog signal converter comprised of:
    a microprocessor having a plurality of inputs and outputs, said microprocessor including a first processor input for receiving a first digital signal, a second processor input for receiving a power supply voltage, and a first processor output for transmitting a second digital signal, said microprocessor further including means for processing said first digital signal;
    a low pass filter portion comprising means for receiving said second digital signal and transmitting an analog signal, said low pass filter portion means including a resistor and a capacitor, said resistor having a resistor input connected to said first processor output, a resistance value R, and a resistor output, and said capacitor having a capacitor input connected to said resistor output and a capacitance value C; and
    means for converting said analog signal to said first digital signal comprised of an analog to digital signal converter device, said analog to digital signal converter device having a converter input for receiving said analog signal and a converter output for transmitting said first digital signal, said analog to digital signal converter device further having a resolution of signal conversion N in the range of 8 bit to 10 bit accuracy.

4. The digital to analog signal converter as set forth in claim 3 wherein the analog signal has a minimum signal value of zero volts and a maximum signal value of 4 volts.

5. The digital to analog signal converter as set forth in claim 4 further having a transition time between said minimum signal value and said maximum signal value equal to $-$(resistance value R) * (capacitance value C) * natural log(1/signal conversion accuracy N).

6. The digital to analog signal converter as set forth in claim 5 wherein said analog to digital converter device further includes a reference voltage input.

7. The digital to analog signal converter as set forth in claim 6 wherein said microprocessor samples said analog to digital converter device at a sampling rate S in the range of one sample per microsecond to one sample per second.

8. The digital to analog signal converter as set forth in claim 7 wherein the microprocessor samples said analog to digital converter device at a sampling rate S of 1/60 second between samples.

9. The digital to analog signal converter as set forth in claim 8 wherein said microprocessor further includes means for comparing said first digital signal to a target condition.

10. A digital to analog signal converter having an analog voltage output of zero volts on startup, said digital to analog signal converter comprised of:
   a microprocessor having a plurality of inputs and outputs, said microprocessor including a first processor input for receiving a first digital signal, a second processor input for receiving a power supply voltage, and a first processor output for transmitting a second digital signal, said microprocessor further including means for processing said first digital signal;
   software means for controlling said microprocessor processing means, said software controlling means including means for comparing said first digital signal to and determining deviation from a target condition and means for altering said second digital signal in response to said deviation from the target condition;
   a low pass filter portion comprising means for receiving said second digital signal and transmitting an analog signal, said low pass filter portion means including a resistor and a capacitor, said resistor having a resistor input connected to said first processor output, a resistance value R, and a resistor output, said resistor output further comprising said analog output of said digital to analog signal converter, and said capacitor having a capacitor input connected to said resistor output and a capacitance value C; and
   means for converting said analog signal to said first digital signal comprised of an analog to digital signal converter device, said analog to digital signal converter device having a converter input connected to said analog output for receiving said analog signal and a converter output connected to said first processor input for transmitting said first digital signal to said microprocessor.

11. A digital to analog signal converter as set forth in claim 10 wherein said second digital signal further includes a high voltage condition and a relatively lower voltage condition.

12. The digital to analog signal converter as set forth in claim 11 wherein said high voltage condition is substantially equal to said power supply voltage.

13. A method of converting a digital signal to an analog signal comprised of:
   receiving a first digital signal in a first processor input of a microprocessor;
   transmitting a second digital signal from a first processor output of said microprocessor;
   receiving said second digital signal in a low pass filter portion;
   transmitting an analog signal from said low pass filter portion;
   receiving said analog signal in an analog to digital signal converter device;
   converting said analog signal to said first digital signal in said analog to digital signal converter device;
   transmitting said first digital signal from said analog to digital converter device to said microprocessor;
   comparing said first digital signal to a target condition; and
   determining deviation of said first digital signal from said target condition.

14. The method of converting a digital signal to an analog signal a set forth in claim 13 comprising the further step of altering said second digital signal in response to said deviation from the target condition.

* * * * *